(12) United States Patent
Hoshtanar

(10) Patent No.: US 9,151,790 B1
(45) Date of Patent: Oct. 6, 2015

(54) SENSOR PATTERN WITH INACTIVE ELECTRODES IN TRANSMIT (TX) LAYER FOR MUTUAL CAPACITANCE

(71) Applicant: Oleksandr Hoshtanar, Lviv (UA)

(72) Inventor: Oleksandr Hoshtanar, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 405 days.

(21) Appl. No.: 13/693,927

(22) Filed: Dec. 4, 2012

Related U.S. Application Data

(60) Provisional application No. 61/662,525, filed on Jun. 21, 2012.

(51) Int. Cl.
| | | |
|---|---|---|
| *G01R 27/26* | (2006.01) | |
| *G06F 3/041* | (2006.01) | |
| *G01D 5/24* | (2006.01) | |
| *G06K 9/00* | (2006.01) | |
| *G06F 3/044* | (2006.01) | |

(52) U.S. Cl.
CPC .............. *G01R 27/2605* (2013.01); *G01D 5/24* (2013.01); *G06F 3/044* (2013.01); *G06K 9/0002* (2013.01)

(58) Field of Classification Search
CPC ....... G01D 5/24; G01D 5/241; G01D 5/2412; G01D 5/2415; G06K 9/00006; G06K 9/00013; G06K 9/0002; G01F 23/22; G01F 23/26; G01F 23/263; G01F 23/266; G06F 3/044; G06F 3/045; G06F 3/0488; G01R 27/2605
USPC .......... 324/686, 661, 660, 658; 345/174, 173; 702/52, 47
See application file for complete search history.

(56) References Cited

U.S. PATENT DOCUMENTS

| | | | | |
|---|---|---|---|---|
| 6,639,315 | B2 | 10/2003 | Kazama et al. | |
| 8,638,107 | B2* | 1/2014 | Schwartz et al. | 324/658 |
| 8,749,518 | B2* | 6/2014 | Kuo | 345/174 |
| 2008/0158175 | A1 | 7/2008 | Hotelling | |
| 2008/0309633 | A1 | 12/2008 | Hotelling et al. | |
| 2009/0273570 | A1 | 11/2009 | Degner et al. | |
| 2010/0110038 | A1 | 5/2010 | Mo et al. | |
| 2010/0193257 | A1 | 8/2010 | Hotelling et al. | |
| 2010/0253651 | A1* | 10/2010 | Day | 345/175 |
| 2010/0328228 | A1 | 12/2010 | Elias et al. | |
| 2011/0007020 | A1 | 1/2011 | Hong et al. | |
| 2012/0092350 | A1 | 4/2012 | Ganapathi et al. | |
| 2013/0015868 | A1* | 1/2013 | Peng | 324/688 |
| 2013/0027344 | A1* | 1/2013 | Choon | 345/174 |

FOREIGN PATENT DOCUMENTS

WO 2011058562 A1 5/2011

OTHER PUBLICATIONS

Camacho, Oscar, "Designing Touch Sensing Electrodes," Freescale Semiconductor Application Note, Document No. AN3863, Rev. 4, Jul. 2011; 28 pages.

(Continued)

*Primary Examiner* — Hoai-An D Nguyen
(74) *Attorney, Agent, or Firm* — Morgan, Lewis & Bockius LLP

(57) ABSTRACT

Apparatuses and methods of equalizing mutual capacitances of sense arrays using inactive electrodes disposed between or within transmit (TX) electrodes and aligned in relation to the receive (RX) electrodes.

19 Claims, 13 Drawing Sheets

(56) References Cited

OTHER PUBLICATIONS

Yazici, Serkan, "Suppression of Spurious Modes via Dummy Electrodes and 2% Frequency Shift via Cavity Size Selection for 1 GHz AlN MEMS Contour-Mode Resonators," IEEE Frequency Control Symposium (FCS), May 21-24, 2012, pp. 1-5; 5 pages.

Search Report for "Sensor Pattern With Inactive Electrodes in Transmit (TX) Layer for Mutual Capacitance", dated Oct. 2012, 5 pages.

* cited by examiner

SENSOR PATTERN WITH INACTIVE ELECTRODES IN TRANSMIT (TX) LAYER FOR MUTUAL CAPACITANCE

RELATED APPLICATIONS

This application also claims the benefit of U.S. Provisional Application No. 61/662,525, filed Jun. 21, 2012, the entire contents of which is hereby incorporated by reference.

TECHNICAL FIELD

The present disclosure relates generally to capacitance-sensing systems, and more particularly sensor patterns of capacitance-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance; 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings in which.

DETAILED DESCRIPTION

Figure 1:
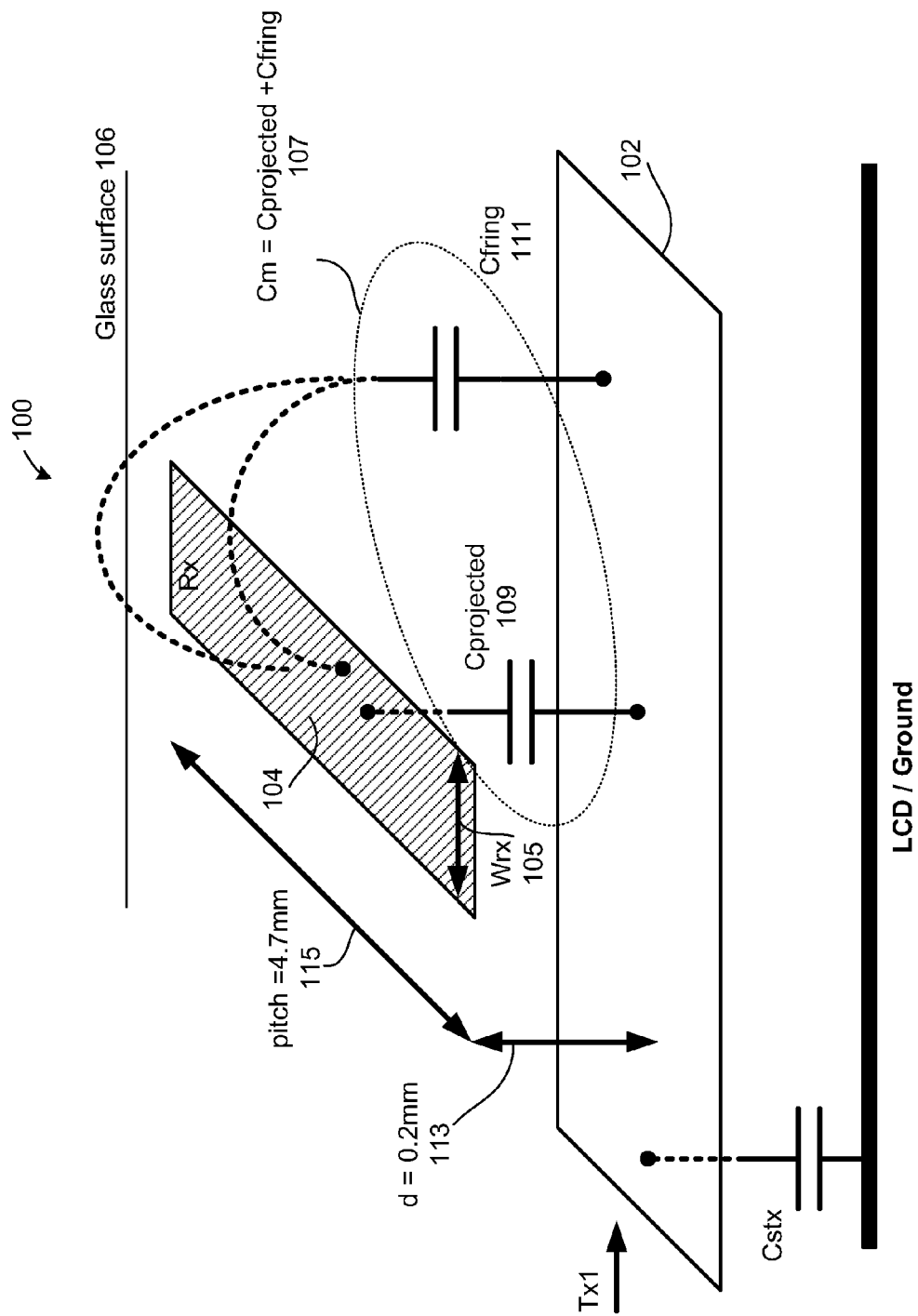
FIG. 1 illustrates a typical unit cell of a bar and strip sensor pattern according to one implementation.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Sensor patterns, as used herein, refer to a layout of electrodes of a sense array. In particular, a sense array may have a first set of electrodes, such as transmit (TX) electrodes, and a second set of electrodes, such as (RX) electrodes). The embodiments described herein are directed to sensor patterns with inactive electrodes, referred to as dummy electrodes herein, disposed in relation to the one of the other sets of electrodes, such as the RX electrodes for various advantages as described herein. For example, the dummy electrodes can be used to equalize baseline capacitance values for the mutual capacitance (also referred to herein as a baseline mutual capacitance or baseline values of mutual capacitance) measured between the TX electrodes and RX electrodes. In particular, a mutual capacitance at an intersection of a RX electrode and a TX electrode (also referred to as a sense element or a unit cell) can be measured when no conductive object is present on the sense array. An intersection between two sense elements may be understood as a location at which one sense electrode crosses over or overlaps another, while maintaining galvanic isolation from each other. A dummy electrode refers to an electrode that is not being driven, like the TX electrodes, and is not being used for sensing, like the RX electrodes. The dummy electrode can be grounded, floating (not tied to a particular voltage potential), or a combination of both. The dummy electrode may be considered a detached ITO island or patch, a grounded patch, a floating patch. The dummy electrodes can be integrated in the TX layer, as well as in a separate layer than the TX layer. The dummy electrodes are substantially aligned with the RX electrodes as described herein. In one embodiment, the dummy electrodes are centered about the RX electrodes, such as the center axes of both are aligned. Alternatively, the dummy electrodes can be aligned to the RX electrodes in other configurations as would be appreciated by one of ordinary skill in the art.

One type of sensor pattern that is broadly used in a bars and strips sensor pattern, such as in touch screen devices as described below with respect to FIGS. 1 and 2.

Figure 2:
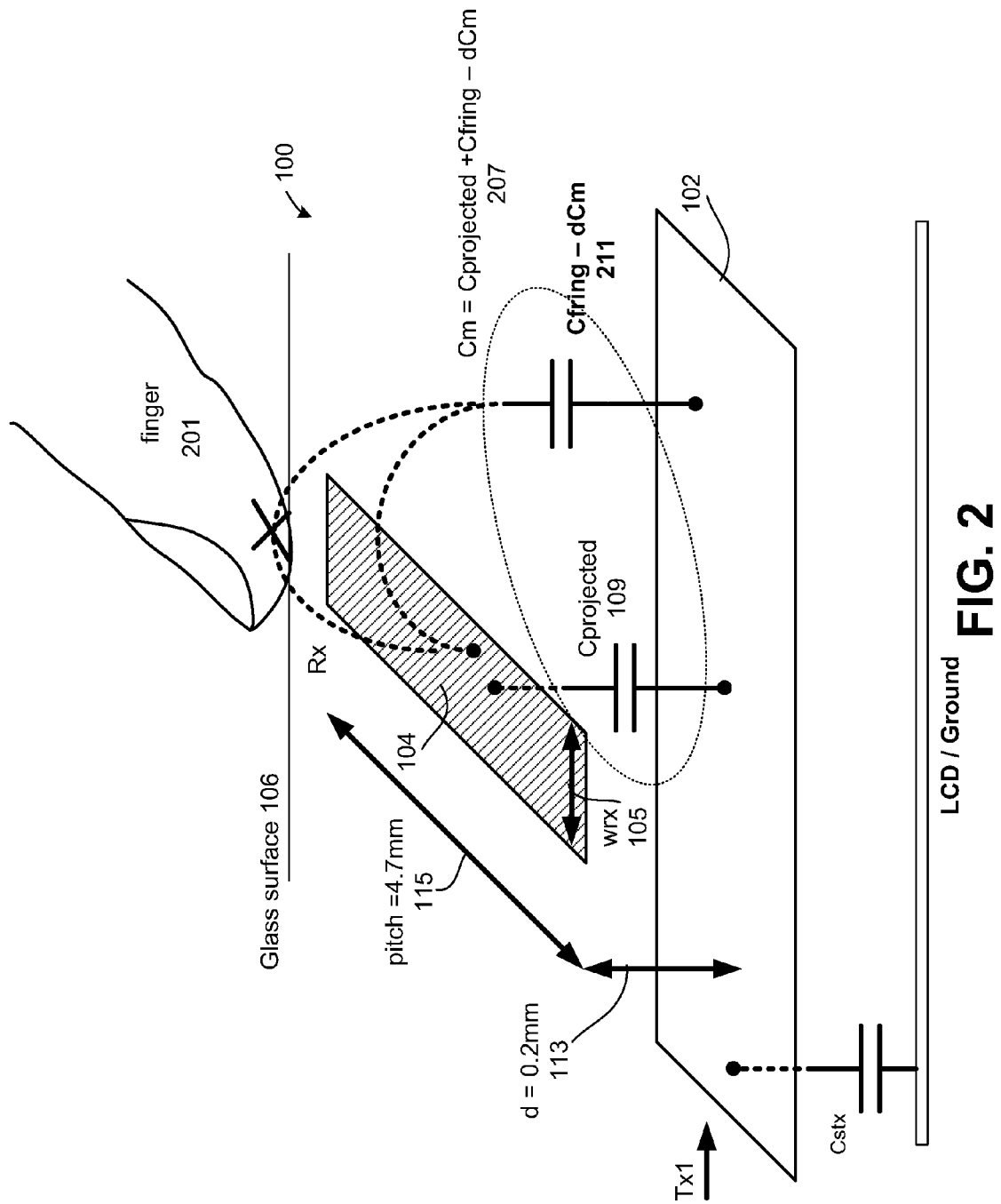
FIG. 2 illustrates the typical unit cell of FIG. 1 when a finger is proximate to the unit cell according to one implementation.

FIGS. 1 and 2 illustrate a typical unit cell 100 of a bar and strip sensor pattern according to one implementation. The structure includes a TX electrode 102 that is located in a bottom indium tin oxide (ITO) layer and a RX electrode 104 that is located in a top ITO layer. In this implementation, the TX electrodes 102 (only one electrode is shown in FIG. 1) are made in the form of wide bars, which substantially fill the bottom ITO layer. This may be done to help block the noise from a display (e.g., liquid crystal display (LCD)). The Rx electrodes 104 are made in the form of narrow strips, such as, for example, with a width wrx 105 0.4 mm. Static mutual capacitance between TX electrode 102 and RX electrode 104 is called mutual capacitance baseline, Cm 107. Schematically, Cm 107 can be divided into Cprojected 109 and Cfring 111. Cprojected 109 is a constant term which is defined by the electric field confined between the bottom surface of RX electrode 104 and the top surface of TX electrode 102. The value of Cprojected 109 is found by parallel capacitance formula in the equation below:

$$Cprojected = \varepsilon \cdot \varepsilon_0 \cdot \frac{A}{d} = \varepsilon \cdot \varepsilon_0 \cdot wrx \cdot \frac{pitch}{d} \quad (1)$$

For a given geometry, Cprojected 109 is constant and does not depend on a conductive object, such as a finger, on a surface 106 (e.g., surface of glass overlay) above the unit cell 100, as illustrated in FIG. 2. In contrast, Cfring 111 changes when a conductive object (e.g., finger) 201 is present, as illustrated in FIG. 2. Cfring 111 is formed by the field between edges and top surface of RX electrode 104 and TX electrode 102. This field partially extends above the surface 106, so it can be interrupted by a conductive object 201 (Cfring-ΔCm 211). It should be noted that Cprojected 109 and Cfring 111 physically are not separate capacitances. Both capacitances are in terms of Cm 107. There is no rigorous equation for Cfring 111 and Cm 107, but there are empiric formulas.

There is a trend in sensor patterns to have a thin stack-up; thus, an insulation layer between TX electrode 102 and RX electrode 104 is becoming thinner, such as from 200 μm (0.2 mm) down to less than 100 μm. Although not expressly illustrated, d 113 represents that thickness of the insulation layer between TX electrode 102 and RX electrode 104. However, a reduction in d 113 makes Cprojected 109 considerably higher. This, in turn, can lead to one or more of the following problems: 1) slowing capacitance measurements; 2) increasing power consumption; and 3) necessitating larger integration capacitor in the measurement circuit, which may increase the price of the device.

Typically, the pitch 115 of the RX electrode 104 is about 5 mm and the insulation thickness d 113 is about 0.2 mm. The market driven tendency is reduction of the insulation to 0.1 mm in the nearest future. From equation (1), with a fixed pitch and a decreased insulator thickness d 113, Cprojected 109 can be maintained only if the wrx 105 is decreased. With reduction of wrx sensitivity, Cm, falls and resistance of RX electrode 104 increases, which can decrease speed of measurements.

The embodiments described are directed to sensor patterns with dummy electrodes for use in mutual capacitance sensing methods. The proposed sensor patterns can be employed in methods of balancing baselines of mutual capacitances of the sense array. The dummy electrodes are used to adjust the static mutual capacitance between the TX electrodes and RX electrodes. The mutual capacitance adjustments between TX and RX electrodes in a sense arrays, such as for touch screen, can be useful for the following: 1) Equalization of Cm within different unit cells. For instance, unit cells may have different size in the centre and edges of the sensor. 2) Fine adjustment of Cm for use with certain measurement hardware (Cint, receive channel engine). 3) Reduction of ΔCm in unit cells with very thin insulation, such as used in in-cell touch panels (also referred to as In/On-cells) in which common electrodes (VCOM) for the display are used for the TX layer. The reduction of Cm baseline with keeping dCm unchanged allows using smaller integration capacitor in a touch controller. This in turn may save the silicon area and reduces the cost of the touch controller integrated circuit (IC). 4) Dummy electrodes in TX layer under TX strips may bring some improvement to optical quality of the unit cell. 5) A unit cell with grounded dummy electrodes may be more immune against charger noise or finger coupled noise (noise introduced via the finger or other conductive object proximate to the sense array). In the case when dummy electrodes are grounded via strips running along TX bars, as in FIGS. 8 and 9, additional coupling of finger to ground is formed. The equivalent circuit in FIG. 10 explains how charger noise current, ichg_noise, may be diverted to reduce impedance so that less current goes to the RX channel.

Figure 3:
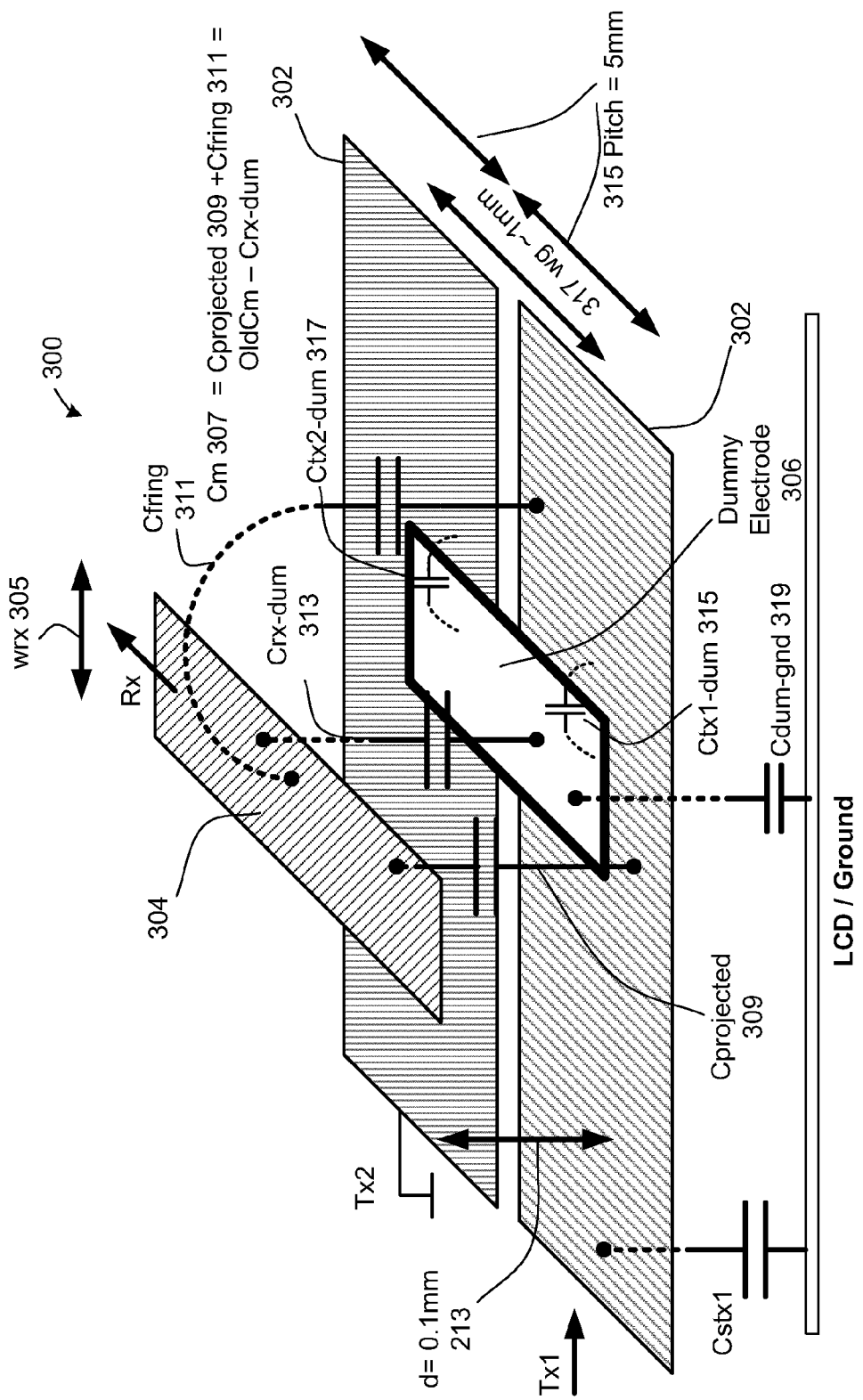
FIG. 3 illustrates a unit cell of a bar and strip sensor pattern with a dummy electrode according to one embodiment.

FIG. 3 illustrates a unit cell 300 of a bar and strip sensor pattern with a dummy electrode 306 according to one embodiment. Mutual capacitance baseline can be reduced by adding the dummy electrode 306 (e.g., grounded patch or detached floating member such as an ITO island) in bottom ITO layer (TX layer) directly under the RX strips 304 as shown in FIG. 3. The structure with dummy electrode 306 should not effect the sensitivity ΔCm, because ΔCm is a part of Cfring 311. This allows keeping RX electrode 304 width wrx 305 (e.g., 0.4 mm) with acceptable resistance, such as below 25 KOhms. In this embodiment, a width of dummy electrode 306 is approximately the same as width 305 of the Rx strip. More generally, the dummy electrode 306 may have a width that is equal to or less than the width 305 of the RX electrode 304; otherwise, sensitivity of the unit cell can be undermined. Height 317 (wg) of the dummy electrode 306 is a fraction of TX width. For example, the TX width, which is also considered the pitch 315, may be 5 mm, and the dummy electrode height 317 is typically 1 mm to 2 mm in length. The Cm 307 can be fine-tuned by the electrode height 317 (wg). Height 307 of the dummy electrode 306 defines for how much Cprojected 309 is reduced. Crx-dum 313 is a capacitance formed between Rx electrode 304 and the dummy electrode. Crx-dum 313 can be calculated by the parallel capacitance formula.

The dummy electrode 306 can be floating or grounded. In embodiments where the dummy electrode 306 is grounded (referred to as grounded dummy electrode), Crx-dum 313 adds to the parasitic capacitance of the Rx strip 304. Some extra capacitance is also added to TX electrode 302 by formed lateral capacitance 315, Ctx1-dum. In the embodiment where the dummy electrode 306 is floating (referred to as floating dummy electrode), Crx-dum 313, Ctx1-dum 315, Ctx2-dum 317 and Cdum-gnd 319 form a more complex network, where Crx-dum 313 is in series with Ctx2-dum 317.

Figure 5:
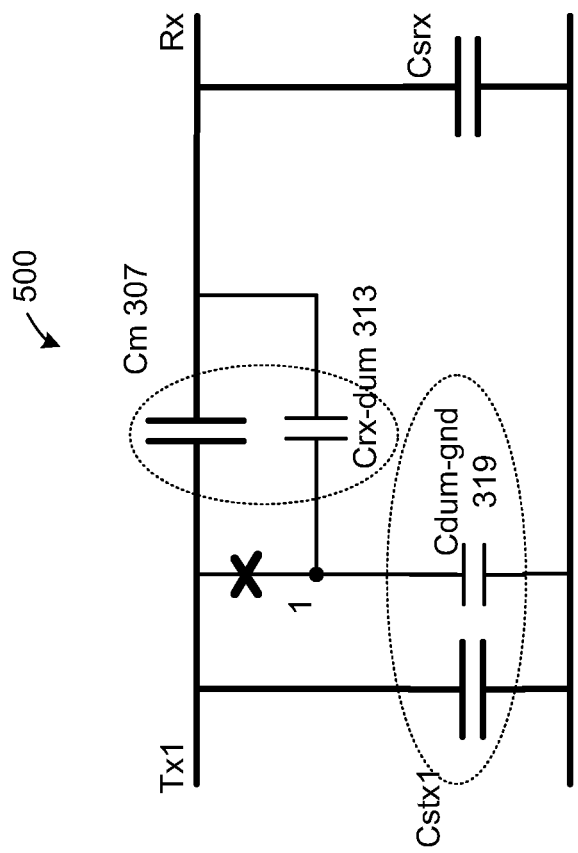
FIG. 5 illustrates an equivalent circuit of a bars and strips sensor pattern with a dummy electrode according to one embodiment.
Figure 4:
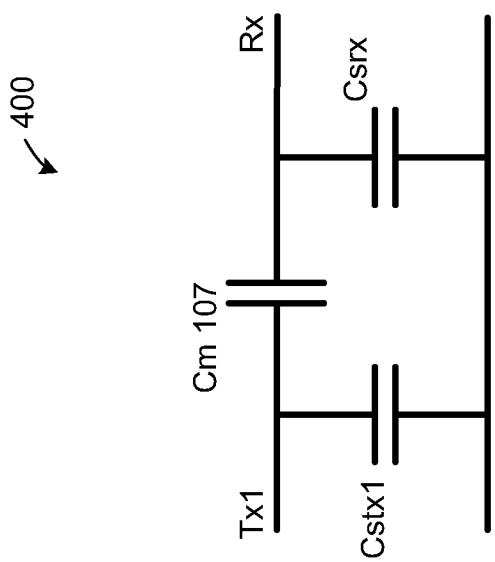
FIG. 4 illustrates an equivalent circuit of a typical bars and strips sensor pattern.
Figure 6:
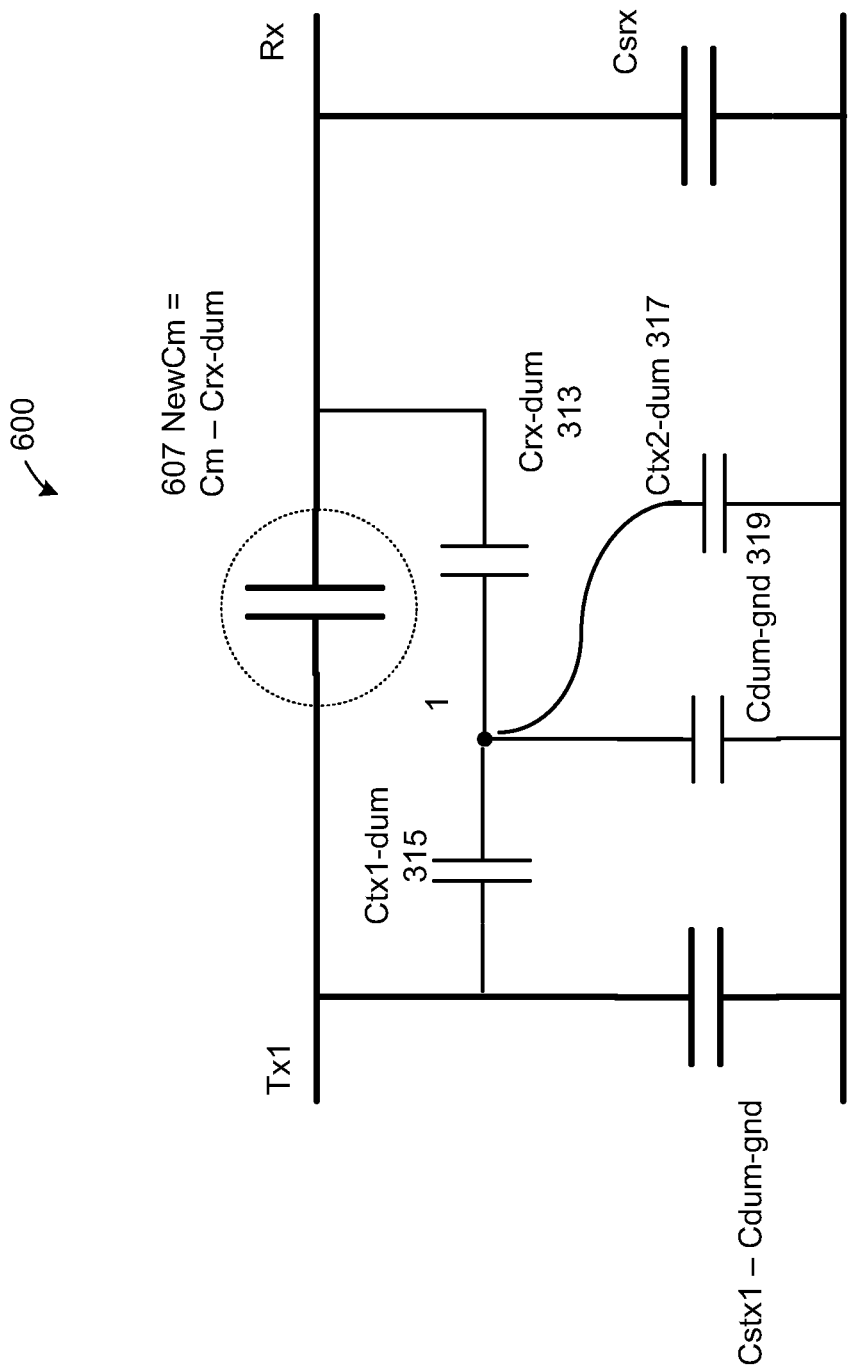
FIG. 6 illustrates an equivalent circuit of a bars and strips sensor pattern with a floating dummy electrode according to another embodiment.
Figure 7:
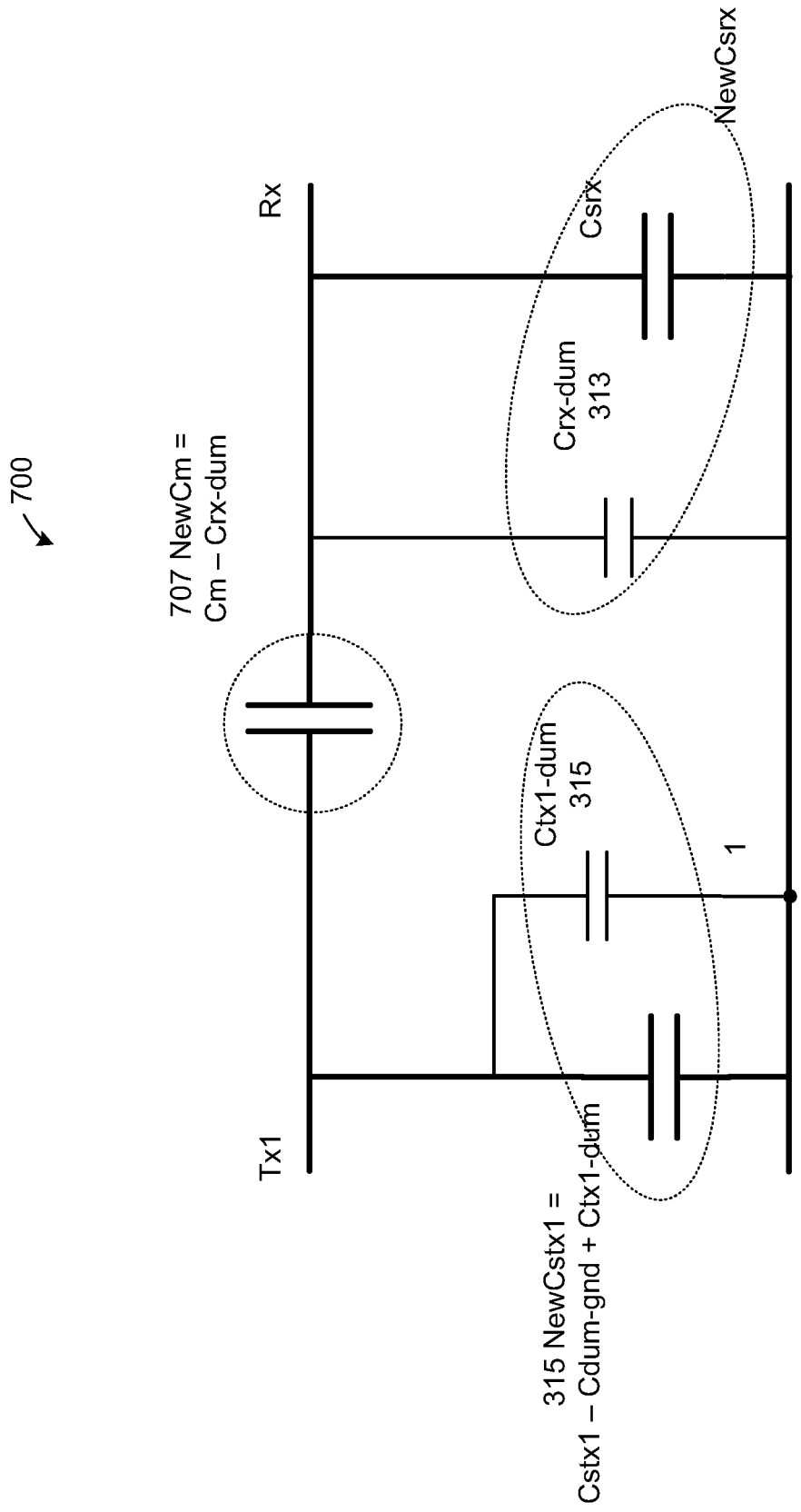
FIG. 7 illustrates an equivalent circuit of a bars and strips sensor pattern with a grounded dummy electrode according to another embodiment.

An equivalent circuit 400 of the regular bars and strips unit cell is shown in FIG. 4. The equivalent circuit 400 represents the unit cell 100 illustrated in FIGS. 1 and 2. Transition to a structure with floating dummy electrode is shown in equivalent circuits 500 and 600 in FIGS. 5-6, and an equivalent circuit 700 of the unit cell with grounded dummy electrode is shown in FIG. 7. The equivalent circuit 600 represents the unit cell 300 when the dummy electrode 306 is floating. Cm 607 represents the Cm 307 when the dummy electrode 306 is floating. The equivalent circuit 700 represents the unit cell 300 when the dummy electrode 306 is grounded. Cm 707 represents the Cm 307 when the dummy electrode 306 is grounded. It should be noted that the number "1" in FIGS. 6 & 7 represents the new node added to the circuit diagram due to the addition of the dummy electrode.

Figure 8:
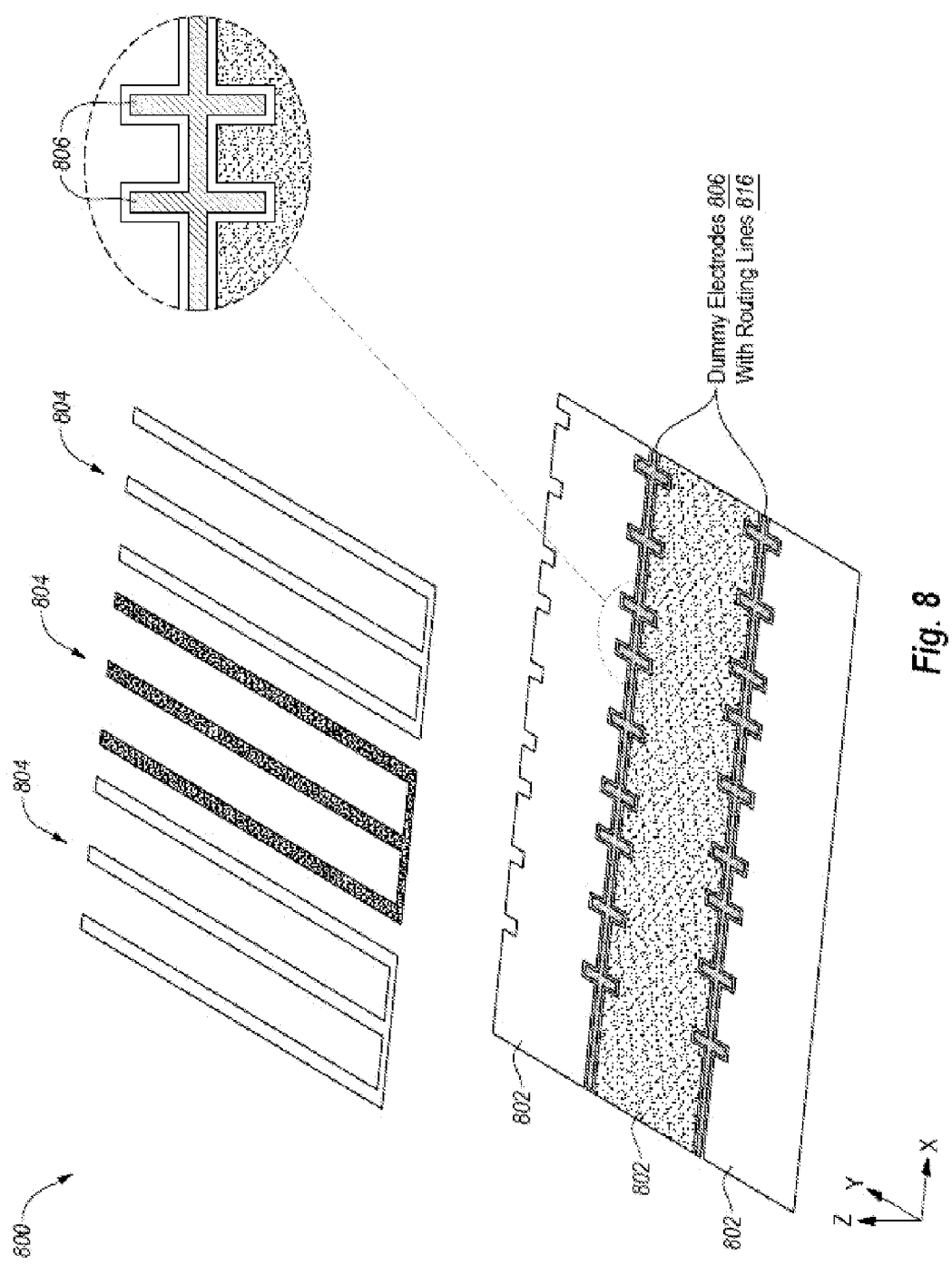
FIG. 8 illustrates a perspective view of a three-by-three array with dummy electrodes and routing lines according to one embodiment.
Figure 9:
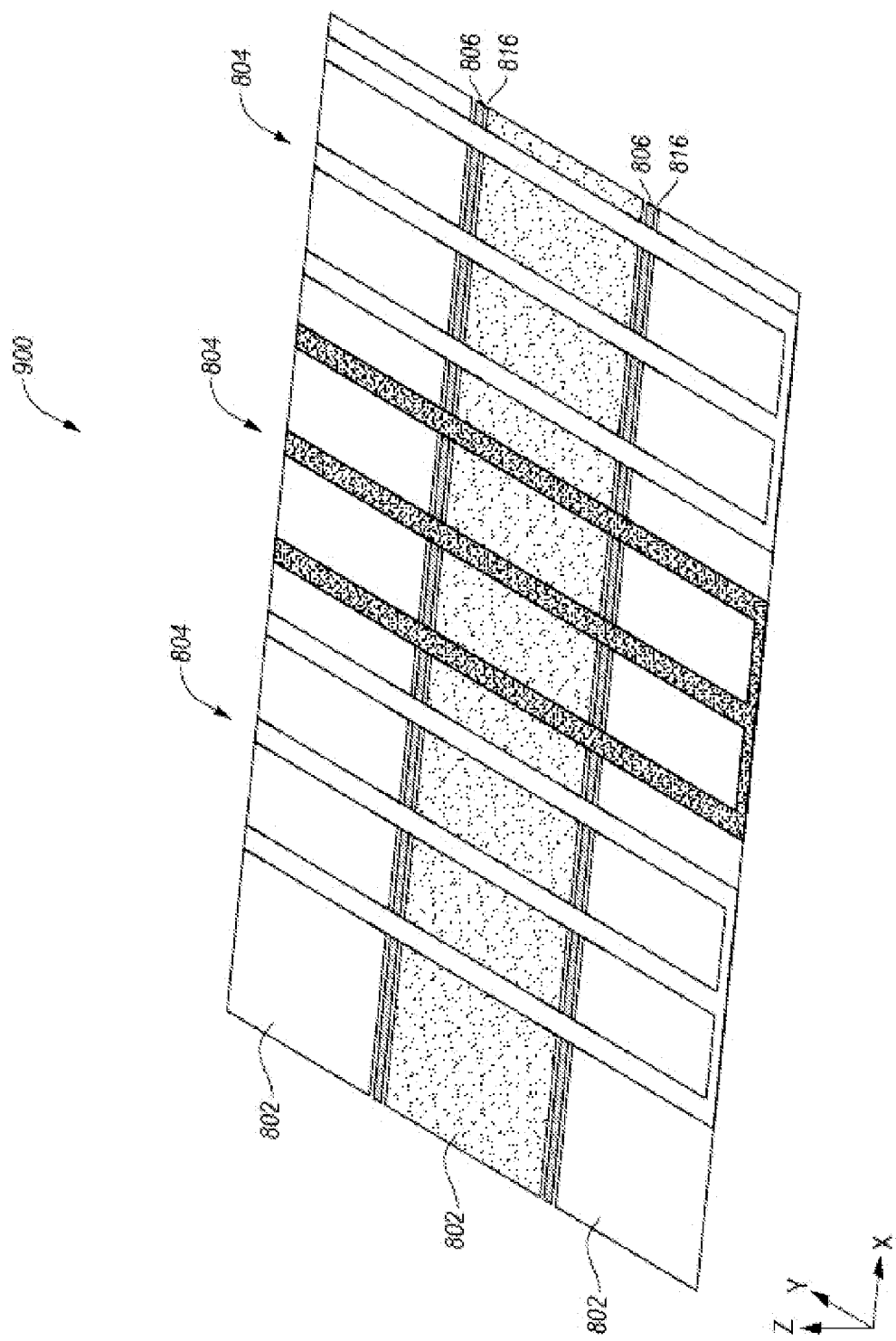
FIG. 9 illustrates another perspective view of the three-by-three array with dummy electrodes and routing lines according to one embodiment.

The dummy electrode 306 of FIG. 3 can be implemented into various sensor patterns. For example, the dummy electrode 306 can be implemented in a dual layer stackup, where the TX electrodes are in a bottom layer of the sense array and the RX electrodes are in the top layer. As the RX electrodes are sensitive to display noise, the wider TX electrodes in the bottom layer form a barrier against the noise generated in the display. This effectively builds the shield functionality into the sensor pattern. A MH3 pattern, as developed by Cypress Semiconductor, San Jose Calif., can integrate dummy electrodes as illustrated in FIGS. 8 and 9. The MH3 pattern is a version of bars and strips structure as described herein.

FIG. 8 illustrates a perspective view of a three-by-three array 800 with dummy electrodes 806 and routing lines 816 according to one embodiment. The three-by-three array 800 includes three TX electrodes 802, three RX electrodes 804, and multiple dummy electrodes 806 coupled together via routing lines 816. The TX electrodes 802 are wide bars disposed in a bottom layer, such as a bottom ITO layer. The RX electrodes 804 each include three strips that are coupled at one end, forming an "E" shape. The perspective view of FIG. 8 shows the RX electrodes 804 and the TX electrodes 802 apart to not obscure the TX electrodes 802. The perspective view of FIG. 9 shows the RX electrodes 804 and TX electrodes 802 in an assembled stackup, where the RX electrodes 804 are closer to the TX electrodes 802 with an insulating layer (not illustrated) disposed between the RX layer and the TX layer. Of course, FIGS. 8 and 9 are not drawn to scale, but FIG. 9 illustrates how the dummy electrodes 806 align with the RX electrodes 804. In particular, the dummy electrodes 806 are disposed below the RX electrodes 804 in this stackup. Of course, the dummy electrodes 806 can be disposed above the RX electrodes 804, when the TX electrodes 802 are disposed in a layer that is above the RX electrodes 804. Also, although illustrated in the same layer as the TX layer, the dummy electrodes 806 can be disposed in a separate layer between the RX layer and the TX layer, or in a separate layer below the TX layer as would be appreciated by one of ordinary skill in the art having the benefit of this disclosure.

In this embodiment, the dummy electrodes 806 are coupled to one another with the routing lines 816. These routing lines 816 can be used to couple the dummy electrodes 806 to ground. In another embodiment, the dummy electrodes 806 can be coupled to a voltage potential other than ground or can be left uncoupled to be floating dummy electrodes.

As described herein, the Cm 307 can be fine-tuned by the electrode height 317 (wg). Simulations of tuning the wg parameter reveal that the Cm baseline can be reduced to as much as 29%, while the sensitivity ΔCm stays unchanged. As a result, the insulating layer thickness d can be reduced in designs, such as for in/on-cell touch panels. For example, the insulating layer thickness can be 0.1 mm when using the dummy electrodes. In-cell technology from AU Optronics features insulation layer of only 7 um, which is reflected in very high parasitic capacitance. Application of dummy electrodes may reduce Cm baseline and parasitic capacitance of RX electrodes of in-cell touch panels. The dummy electrodes 806 can provide equalization of Cm across the MH3 sensor pattern with different unit cells.

As described above, a unit cell with grounded dummy electrodes may be more immune against charger noise or finger coupled noise (noise introduced via the finger or other conductive object proximate to the sense array). In FIGS. 8 and 9, the dummy electrodes 806 are grounded via routing lines 816 (strips) running along TX bars 802. The dummy electrodes 806 that are grounded forms additional coupling between the conductive object (e.g., finger) to ground. The equivalent circuit in FIG. 10 explains how charger noise current, ichg_noise, may be diverted to reduce impedance so that less current goes to the RX channel.

Figure 10:
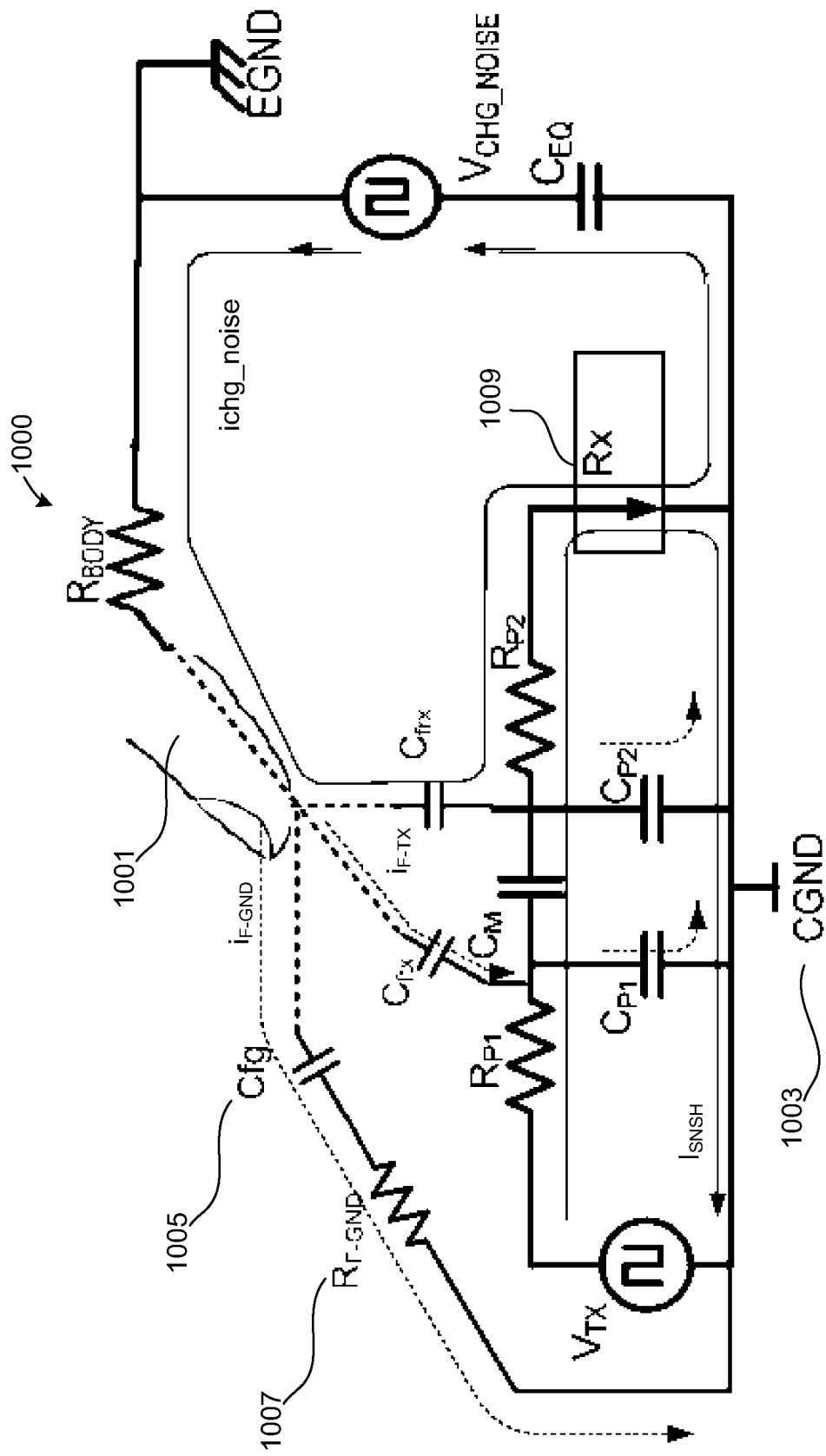
FIG. 10 illustrates a charger-noise equivalent circuit with a sensor pattern with grounded dummy electrodes.

FIG. 10 illustrates a charger-noise equivalent circuit 1000 with a sensor pattern with grounded dummy electrodes. The dummy electrodes form additional coupling between the conductive object 1001 and ground 1003, as represented by Cfg 1005 and $R_{r\text{-}GND}$ 1007. Charger noise current, ichg_noise, which is injected from the tip of the conductive object, such as a fingertip, splits on $i_{F\text{-}Tx}$, $i_{F\text{-}Rx}$ and $i_{F\text{-}GND}$ and only $i_{F\text{-}RX}$ goes via RX channel 1009. Reducing impedance of Cfg 1005 and $R_{r\text{-}GND}$ 1007, less current goes to the RX channel 1009. The sensor pattern with dummy electrodes may be more immune against charger noise or other finger coupled noise. Alternatively, the noise can be introduced via the conductive object from other external noise sources.

The dummy electrodes can have various shapes, such as those illustrated in FIGS. 3, 8 and 9. Also, the dummy electrodes are disposed between TX electrodes. Alternatively, the dummy electrodes may have other shapes and can be disposed in other configurations, such as within the TX electrodes, or on separate layers than the TX layer.

Figure 11:
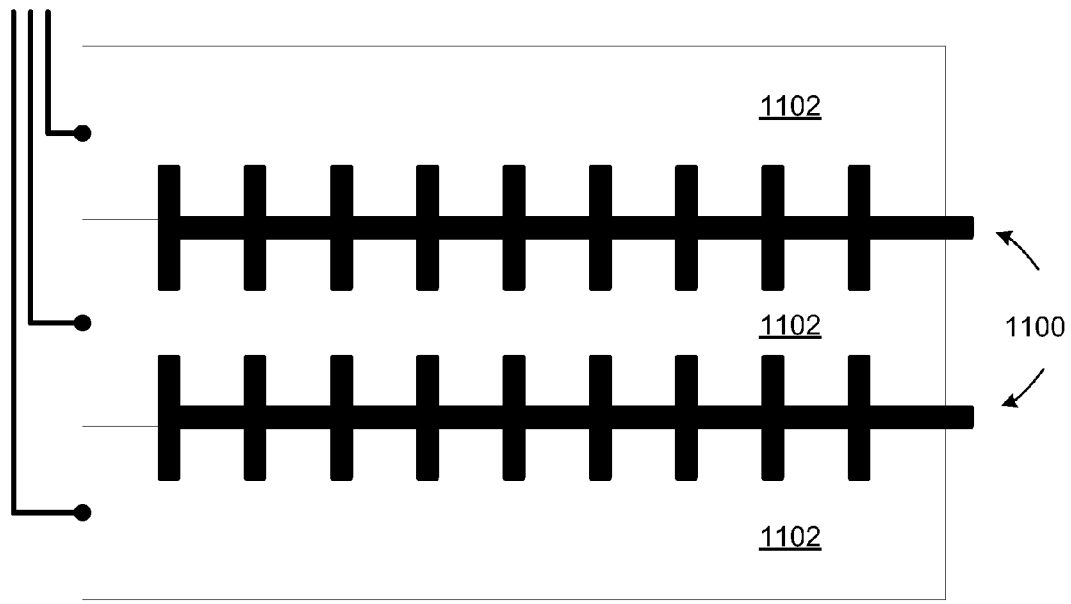
FIG. 11 illustrates dummy electrodes positioned between TX electrodes according to one embodiment.

FIG. 11 illustrates dummy electrodes 1100 positioned between TX electrodes 1102 according to one embodiment. In this embodiment, the dummy electrodes 1100 are disposed between gaps in the TX electrodes 1102. The dummy electrodes 1100 are coupled via routing lines that extend out an opposite side as routing lines coupled to the TX electrodes 1102. Alternatively, the routing lines can extend out the same side or in other configurations.

Figure 12:
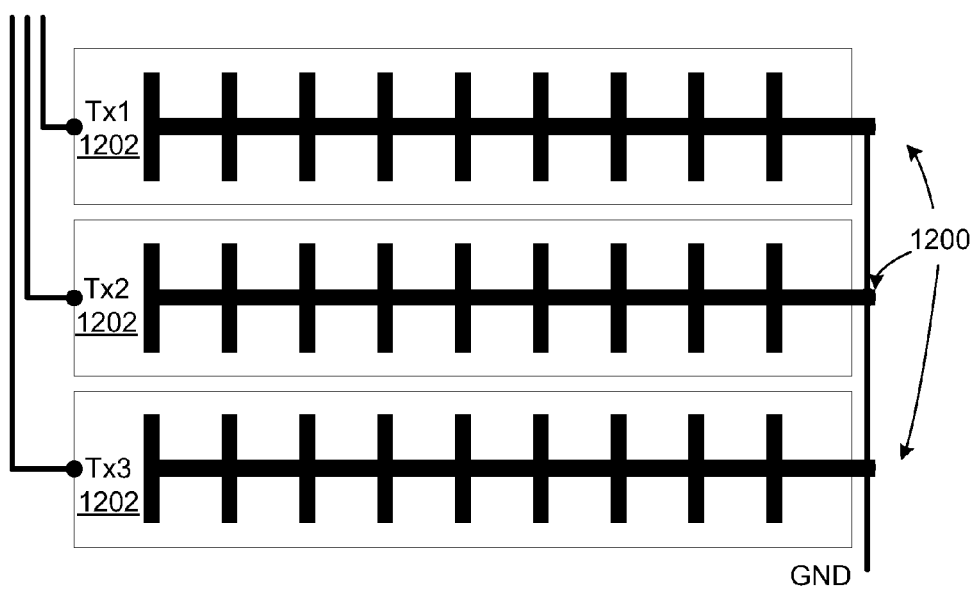
FIG. 12 illustrates dummy electrodes positioned within TX electrodes according to one embodiment.

FIG. 12 illustrates dummy electrodes 1200 positioned within TX electrodes 1202 according to one embodiment. Instead of being disposed between TX electrodes as shown in FIG. 11, the dummy electrodes 1200 are disposed within the TX electrodes 102. For example, multiple dummy electrodes 1200 can be disposed partially or wholly inside an outer boundary of the TX electrode 1202. Also, in this embodiment, the dummy electrodes 1200 are coupled via routing lines that extend out an opposite side as routing lines coupled to the TX electrodes 1202. Alternatively, the routing lines can extend out the same side or in other configurations. It should also be noted that the TX electrodes can be disposed on the same layer as the TX layer in which the TX electrodes are disposed. Alternatively, the TX electrodes can be disposed in other layers than the TX layer or the RX layer, such as an intervening layer between the TX layer and the RX layer or a layer below the RX layer and the TX layer. In one embodiment, the dummy electrodes can be on a separate layer below TX layer. In this embodiment, a LCD to TX capacitance may be reduced, which in turn reduces LCD-related noise in the RX layer.

Figure 13:
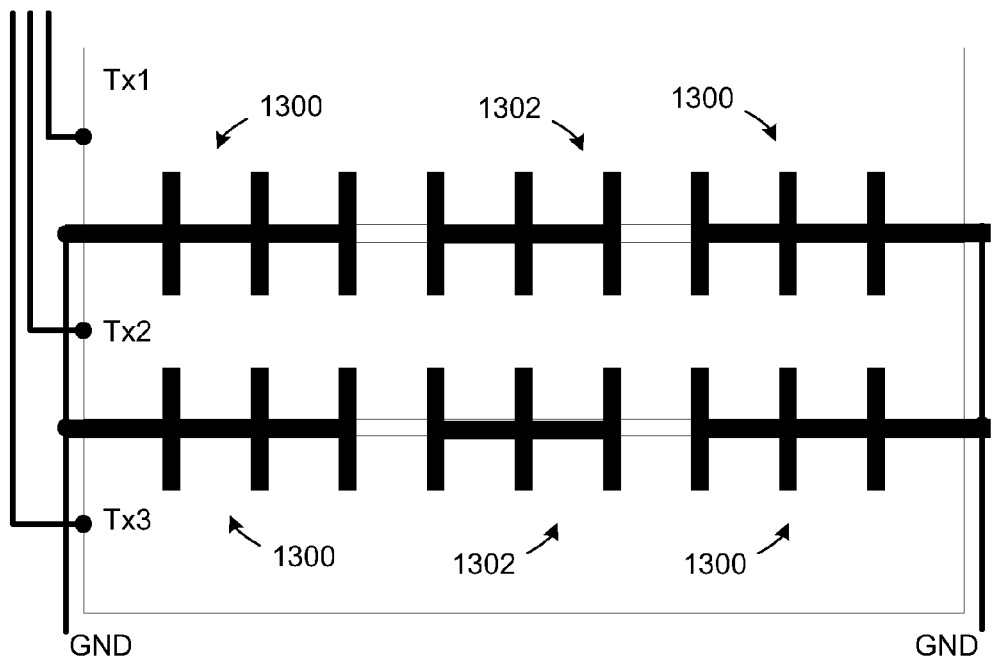
FIG. 13 illustrates a first set of grounded dummy electrodes and a second set of floating dummy electrodes according to one embodiment.

FIG. 13 illustrates a first set of grounded dummy electrodes 1300 and a second set of floating dummy electrodes 1302 according to one embodiment. In this embodiment, the first set of grounded dummy electrodes 1300 are coupled to routing lines that are coupled to ground. In another embodiment, the first set of grounded dummy electrodes 1300 are coupled to other voltage potentials. The second set of floating dummy electrodes 1302 are not coupled to routing lines that are coupled to ground, but are considered as floating electrodes. The second set of floating dummy electrodes 1302 are coupled via a routing line, but this routing line does not extend out to be coupled to ground or another potential. The floating dummy electrodes 1302 are electrically isolated from the first set of grounded dummy electrodes 1300. In some embodiments, the floating dummy electrodes can be linked with each other without being routed to the ground. In the depicted embodiment, the first set includes three dummy electrodes on the left side and three dummy electrodes on the left side, and the second set includes three dummy electrodes in the middle. Alternatively, other numbers of dummy electrodes and other combinations of grounded electrodes and floating electrodes may be used as would be appreciated by one of ordinary skill in the art.

Figure 14:
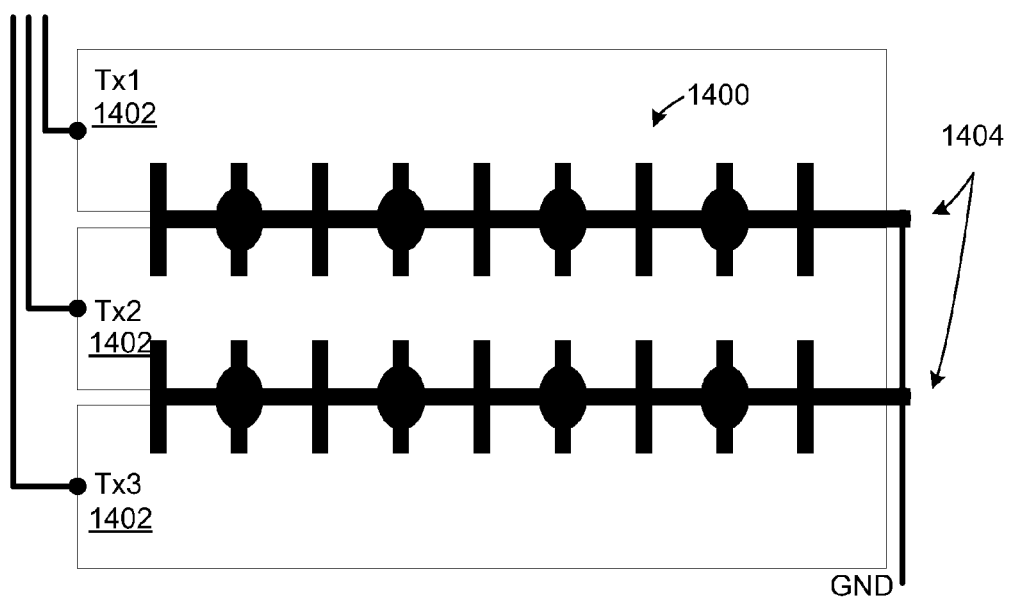
FIG. 14 illustrates dummy electrodes positioned between TX electrodes according to another embodiment.

FIG. 14 illustrates dummy electrodes 1400 positioned between TX electrodes 1402 according to another embodiment. Dummy electrodes 1400 may not resemble the RX electrodes, such as illustrated in FIG. 14. In FIG. 14, the dummy electrodes 1400 have rounded portions that increase the surface area of the dummy electrode near where the dummy electrodes 1400 are coupled to the routing lines 1404. Alternatively, other shapes may be used as would be appreciated by one of ordinary skill in the art.

The embodiments described herein can be used to produce sensor patterns with equalized baseline across unit cells with variable size, such as half-pitch cells on at the edges. With these embodiments, there may be no need to sacrifice system performance for complicated tuning of the baselines across unit cells. The embodiments can also provide faster readout during scanning. As described herein, the dummy electrodes can be used in in-cell technology, as well as for "Sensor on Lens" designs, as well as other technologies. The embodiments can also be used to reduce noise, such as charge-induced noise as described with respect to FIG. 10.

Figure 15:
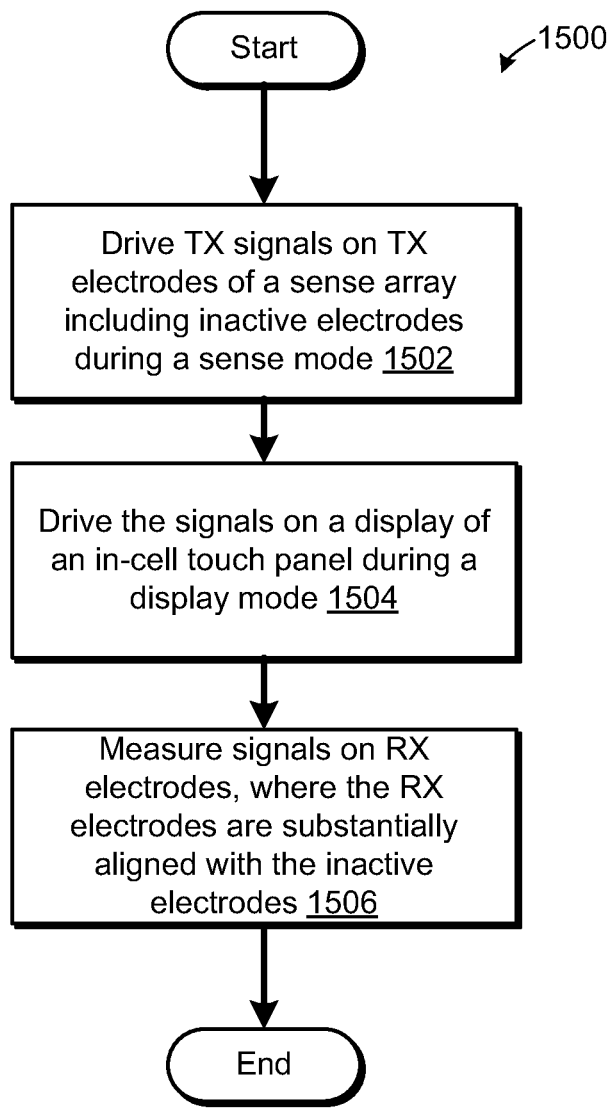
FIG. 15 is a flow diagram of a method of operating a sense array with inactive electrodes according to an embodiment.

FIG. 15 is a flow diagram of a method 1500 of operating a sense array with inactive electrodes according to an embodiment. The method 1500 may be performed by processing logic that may comprise hardware (circuitry, dedicated logic, etc.), software (such as is run on a general purpose computing system or a dedicated machine), firmware (embedded software), or any combination thereof. In one embodiment, the processing device 1610 of FIG. 16 performs the method 1500.

In another embodiment, a touch screen controller (TSC) performs the method 1500. Alternatively, other components of the electronic system 1600 performs some or all of the operations of method 1500.

Referring to FIG. 15, the method 1500 begins with the processing logic driving one or more TX signals on one or more TX electrodes disposed in first orientation in a first layer of a sense array during a sensing mode (block 1502). The sense array includes one or more inactive electrodes disposed in a second orientation. The processing logic drives the signals on a display of an in-cell touch panel during a display mode (block 1504). Of course, in other embodiments, the processing logic does not drive signals on the display when not an in-cell touch panel. The processing logic measures signals on the RX electrodes (block 1506), the RX electrodes being disposed to substantially align with the inactive electrodes, and the method 1500 ends.

In one embodiment, the TSC may be any of the CY8CTMA3xx family of TrueTouch® Multi-Touch All-Points touchscreen controllers, developed by Cypress Semiconductor Corporation of San Jose, Calif. The TrueTouch® controllers can be used with any of the embodiment shown in FIGS. 8, 9, and 11-14, for example. Alternatively, the inactive electrodes may be implemented in other sensor patterns that are coupled to other touchscreen controllers, or other touch controllers of touch-sensing devices.

The embodiments described herein may be used in various designs of mutual capacitance sensing arrays of the capacitance sensing system. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

Figure 16:
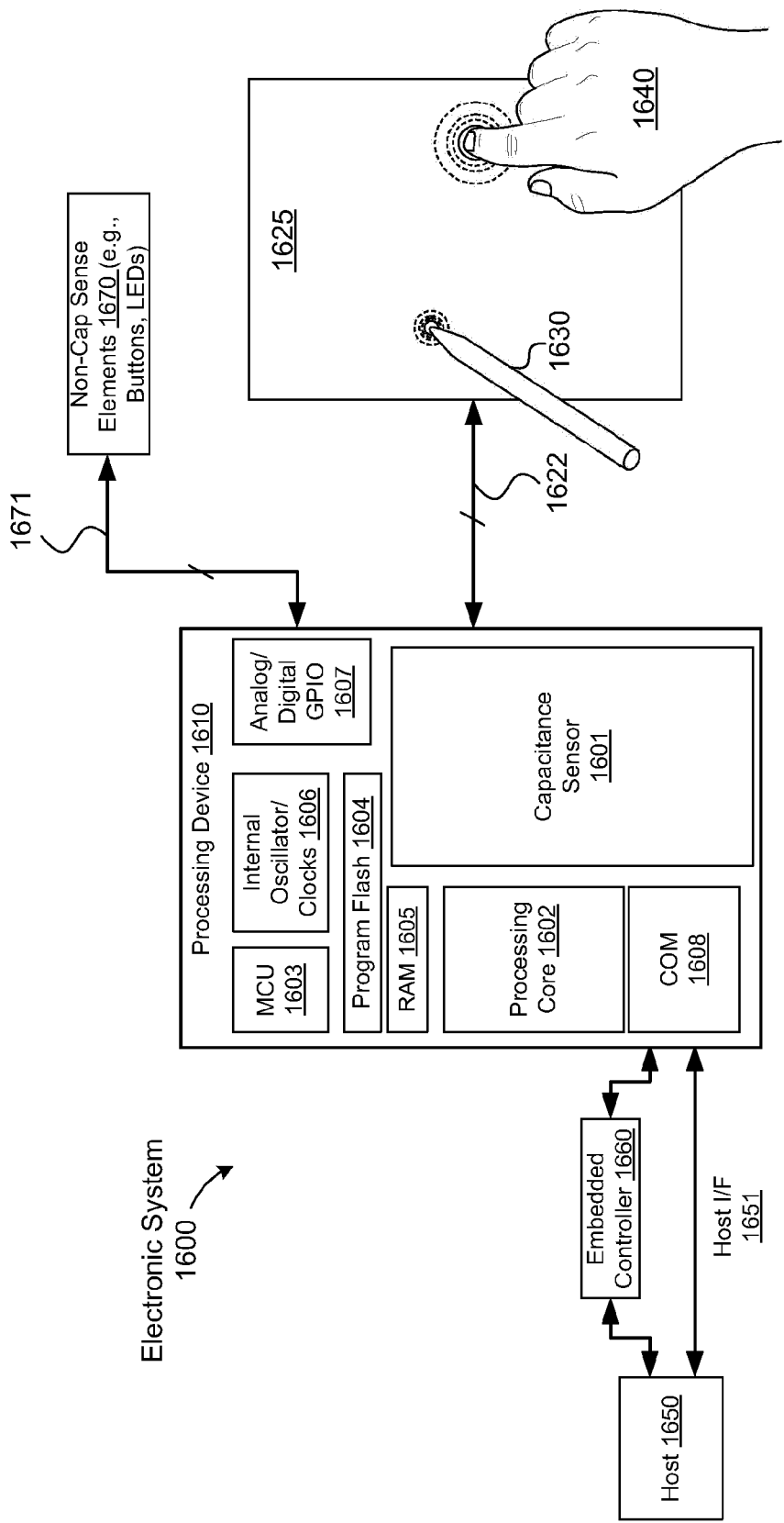
FIG. 16 is a block diagram illustrating one embodiment of an electronic system having a processing device for detecting a presence of a touch object and a stylus proximate to a capacitive sense array with inactive electrodes.

FIG. 16 is a block diagram illustrating one embodiment of an electronic system 1600 having a processing device 1610 for detecting a presence of a touch object and a stylus proximate to a capacitive sense array with inactive electrodes. The processing device 1610 may be any of the TSCs described herein. The processing device 1610 is configured to detect one or more touches on a touch-sensing device, such as the capacitive sense array 1625 that is part of the in-cell touch panels as described herein. The capacitive sense array 1625 includes inactive electrodes (e.g., dummy electrodes) as described herein. The processing device can detect conductive objects, such as touch objects 1640 (fingers or passive styluses, an active stylus 1630, or any combination thereof.

Electronic system 1600 includes processing device 1610, capacitive sense array 1625, stylus 1630, host processor 1650, embedded controller 1660, and non-capacitive sense elements 1670. The capacitive sense elements are electrodes of conductive material, such as copper. The sense elements may also be part of an ITO panel. The capacitive sense elements can be configured to allow the capacitive-sensing circuit 1601 to measure self capacitance, mutual capacitance, or any combination thereof. In the depicted embodiment, the electronic system 1600 includes the capacitive sense array 1625 coupled to the processing device 1610 via bus 1622. The capacitive sense array 1625 may include a multi-dimension capacitive sense array. The multi-dimension sense array includes multiple sense elements, organized as rows and columns. In another embodiment, the capacitive sense array 1625 operates as an all-points-addressable ("APA") mutual capacitive sense array. In another embodiment, the capacitive sense array 1625 operates as a coupled-charge receiver. In another embodiment, the capacitive sense array 1625 is non-transparent capacitive sense array (e.g., PC touchpad). The capacitive sense array 1625 may be disposed to have a flat surface profile. Alternatively, the capacitive sense array 1625 may have non-flat surface profiles. Alternatively, other configurations of capacitive sense arrays may be used. For example, instead of vertical columns and horizontal rows, the capacitive sense array 1625 may have a hexagon arrangement, or the like, as would be appreciated by one of ordinary skill in the art having the benefit of this disclosure. In one embodiment, the capacitive sense array 1625 may be included in an ITO panel or a touch screen panel.

The operations and configurations of the processing device 1610 and the capacitive sense array 1625 for detecting and tracking the touch object 1640 and stylus 1630 are described herein. In short, the processing device 1610 is configured to detect a presence of the touch object 1640, a presence of a stylus 1630 on the capacitive sense array 1625, or any combination thereof. The processing device 1610 may detect and track the stylus 1630 and the touch object 1640 individually on the capacitive sense array 1625. In one embodiment, the processing device 1610 can detect and track both the stylus 1630 and touch object 1640 concurrently on the capacitive sense array 1625. If the touching object is an active stylus, in one embodiment, the active stylus 1630 is configured to operate as the timing "master," and the processing device 1610 adjusts the timing of the capacitive sense array 1625 to match that of the active stylus 1630 when the active stylus 1630 is in use. In one embodiment, the capacitive sense array 1625 capacitively couples with the active stylus 1630, as opposed to conventional inductive stylus applications. It should also be noted that the same assembly used for the capacitive sense array 1625, which is configured to detect touch objects 1640, is also used to detect and track a stylus 1630 without an additional PCB layer for inductively tracking the active stylus 1630.

In the depicted embodiment, the processing device 1610 includes analog and/or digital general purpose input/output ("GPIO") ports 1607. GPIO ports 1607 may be programmable. GPIO ports 1607 may be coupled to a Programmable Interconnect and Logic ("PIL"), which acts as an interconnect between GPIO ports 1607 and a digital block array of the processing device 1610 (not shown). The digital block array may be configured to implement a variety of digital logic circuits (e.g., DACs, digital filters, or digital control systems) using, in one embodiment, configurable user modules ("UMs"). The digital block array may be coupled to a system bus. Processing device 1610 may also include memory, such as random access memory ("RAM") 1605 and program flash 1604. RAM 1605 may be static RAM ("SRAM"), and program flash 1604 may be a non-volatile storage, which may be used to store firmware (e.g., control algorithms executable by processing core 1602 to implement operations described herein). Processing device 1610 may also include a memory controller unit ("MCU") 1603 coupled to memory and the processing core 1602. The processing core 1602 is a processing element configured to execute instructions or perform operations. The processing device 1610 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 1602. In the case of the memory being external to the processing device, the processing device is coupled to the other device in which the memory resides as would be appreciated by one of ordinary skill in the art having the benefit of this disclosure.

The processing device 1610 may also include an analog block array (not shown). The analog block array is also coupled to the system bus. Analog block array may also be configured to implement a variety of analog circuits (e.g., ADCs or analog filters) using, in one embodiment, configurable UMs. The analog block array may also be coupled to the GPIO 1607.

As illustrated, capacitance-sensing circuit 1601 may be integrated into processing device 1610. Capacitance-sensing circuit 1601 may include analog I/O for coupling to an external component, such as touch-sensor pad (not shown), capacitive sense array 1625 with inactive electrodes as described herein, touch-sensor slider (not shown), touch-sensor buttons (not shown), and/or other devices. The capacitance-sensing circuit 1601 may be configured to measure capacitance using mutual capacitance sensing techniques, self capacitance sensing technique, charge coupling techniques or the like. In one embodiment, capacitance-sensing circuit 1601 operates using a charge accumulation circuit, a capacitance modulation circuit, or other capacitance sensing methods known by those skilled in the art. In an embodiment, the capacitance-sensing circuit 1601 is of the Cypress TMA-3xx family of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 1601 in any chosen combination. In one embodiment, the TX and RX electrodes of the sense array 200 are configured to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual capacitance sensing. An intersection between two sense elements may be understood as a location at which one sense electrode crosses over or overlaps another, while maintaining galvanic isolation from each other. The capacitance-sensing circuit 1601 does not use mutual capacitance or self-capacitance sensing to measure capacitances of the sense elements when performing a stylus sensing. Rather, the capacitance-sensing circuit 1601 measures a charge that is capacitively coupled between the sense array 200 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 1625, the object causes a decrease in mutual capacitance between some of the TX/RX electrodes. In another embodiment, the presence of a finger increases the coupling capacitance of the electrodes. Thus, the location of the finger on the capacitive sense array 1625 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of centroid algorithms may be used to detect the center of the touch as would be appreciated by one of ordinary skill in the art having the benefit of this disclosure.

In an embodiment, the electronic system 1600 may also include non-capacitive sense elements 1670 coupled to the processing device 1610 via bus 1671 and GPIO port 1607. The non-capacitive sense elements 1670 may include buttons, light emitting diodes ("LEDs"), and other user interface devices, such as a mouse, a keyboard, or other functional keys that do not use capacitance sensing. In one embodiment, buses 1621, 1622, and 1671 are embodied in a single bus. Alternatively, these buses may be configured into any combination of one or more separate buses.

Processing device 1610 may include internal oscillator/clocks 1606 and communication block ("COM") 1608. In another embodiment, the processing device 1610 includes a spread spectrum clock (not shown). The oscillator/clocks block 1606 provides clock signals to one or more of the components of processing device 1610. Communication block 1608 may be used to communicate with an external component, such as a host processor 1650, via host interface ("I/F") line 1651. Alternatively, processing device 1610 may also be coupled to embedded controller 1660 to communicate with the external components, such as host processor 1650. In one embodiment, the processing device 1610 is configured to communicate with the embedded controller 1660 or the host processor 1650 to send and/or receive data.

Processing device 1610 may reside on a common carrier substrate such as, for example, an integrated circuit ("IC") die substrate, a multi-chip module substrate, or the like. Alternatively, the components of processing device 1610 may be one or more separate integrated circuits and/or discrete components. In one exemplary embodiment, processing device 1610 is the Programmable System on a Chip (PSoC®) processing device, developed by Cypress Semiconductor Corporation, San Jose, Calif. Alternatively, processing device 1610 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 1610 may also be done in the host.

Capacitance-sensing circuit 1601 may be integrated into the IC of the processing device 1610, or alternatively, in a separate IC. Alternatively, descriptions of capacitance-sensing circuit 1601 may be generated and compiled for incorporation into other integrated circuits. For example, behavioral level code describing the capacitance-sensing circuit 1601, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 1601.

It should be noted that the components of electronic system 1600 may include all the components described above. Alternatively, electronic system 1600 may include some of the components described above.

In one embodiment, the electronic system 1600 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, and eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition, and numeric keypad operation.

The embodiments described herein can be used with existing TSCs, which are not developed specifically for in-cell touch panels if the DDI 120 (or 520) provides for the I/O and registers that are part of the display interface definition described herein. Also, as described above, the assignee of the present application has developed various multi-TX phase scanning sensing modes that can be used with the proposed interface. The embodiments may also provide improvement touch systems resulting from the ability to use MPTX, high voltage drive, TSC scanning synchronized to the LCD blanking time, and use of special sensing modes, such as water rejection sensing modes. These improvements may also result in high SNR, better LCD noise immunity and improved performance for stylus, hover and glove touch by use of special sensing modes. Synchronization can be performed between DDI and TSC insofar that TSC has knowledge of the display blank timings. This may be accomplished by routing HSync/VSync signals, or alternative TE signal, to the TSC and programming the TSC to offset the scan timing windows correctly with respect to these display timing reference signals. The knowledge of TX pattern sequence definition in DDI memory allows the system to go beyond the activation of 1 TX per timeslot. Also, the embodiments allow control of TX output signals (ability to provide Hi-Z output on TX lines from DDI 120) by the TSC so that TSC can use the TX lines as inputs. Also, the embodiments described herein may have the ability for TSC to control the TX pattern sequence played out by the DDI. The TSC may also include hardware or software for processing of TE signal from DDI, which can carry either V display reference, or a composite H and V display reference. In case of a composite reference, the TSC needs the processing to only extract a V reference if it is to perform TSC scanning only during the vertical blanking. In an alternative embodiment, synchronization between DDI and TSC can be done without use of discrete interface signals or register control from a single host to multiple ICs by using single-chip integration as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
 a first set of receiver (RX) electrodes of a sense array disposed in a first plane in a first orientation;

a second set of transmit (TX) electrodes of the sense array disposed in a second orientation; and a third set of inactive electrodes disposed in a second plane, wherein individual inactive electrodes of the third set are aligned in relation to corresponding individual RX electrodes of the first set, wherein the RX electrodes and the inactive electrodes comprise widths that are substantially the same and the inactive electrodes are disposed in the second plane in the first orientation.

2. The apparatus of claim 1, further comprising a processing device coupled to the first set of RX electrodes and the second set of TX electrodes.

3. The apparatus of claim 1, wherein the second set of TX electrodes are disposed in the second plane.

4. The apparatus of claim 3, wherein the third set of inactive electrodes are disposed between gaps between the second set of TX electrodes, and wherein the third set of inactive electrodes are electrically isolated from the second set of TX electrodes.

5. The apparatus of claim 3, wherein the third set of inactive electrodes are disposed within the second set of TX electrodes.

6. The apparatus of claim 1, wherein the first set of RX electrodes comprise one or more strips of metal for each of the RX electrodes, and wherein each of the second set of TX electrodes comprises a bar of metal, and wherein the bars of metal comprise a plurality of slots that are aligned with the RX electrodes in which the inactive electrodes are disposed.

7. The apparatus of claim 6, further comprising routing lines disposed between the second set of TX electrodes to couple the third set of inactive electrodes.

8. The apparatus of claim 1, wherein the third set of inactive electrodes are coupled to ground.

9. The apparatus of claim 1, wherein the third set of inactive electrodes are floating electrodes.

10. The apparatus of claim 1, wherein a first subset of inactive electrodes of the third set are coupled to ground and a second subset of inactive electrodes of the third set are floating electrodes.

11. The apparatus of claim 1, wherein the first set of RX electrodes are disposed in a first indium tin oxide (ITO) layer and the second set of TX electrodes are disposed in a second ITO layer, wherein an insulation layer is disposed between the first ITO layer and the second ITO layer, wherein the RX electrodes are RX strips and the TX electrodes are TX bars, wherein the inactive electrodes are strips with widths that are substantially similar than width of the RX strips, and wherein lengths of the strips are less than a width of two of the TX bars.

12. The apparatus of claim 2, wherein the processing device is configured to measure mutual capacitances between the first set of RX electrodes and the second set of TX electrodes to detect a conductive object proximate to the sense array.

13. The apparatus of claim 12, wherein the third set of inactive electrodes are coupled to ground, and wherein the third set of inactive electrodes are configured to reduce noise introduced from an external noise source.

14. The apparatus of claim 12, wherein the third set of inactive electrodes are configured to equalize baseline values of mutual capacitances between the first set of RX electrodes and the second set of TX electrodes.

15. A capacitive sense array comprising:
a first layer comprising a first plurality of electrodes disposed in a first orientation;
a second layer comprising a second plurality of electrodes disposed in a second orientation and a third plurality of inactive electrodes disposed to be substantially aligned with the first plurality of electrodes, wherein the first plurality of electrodes and the third plurality of electrodes comprise widths that are substantially the same; and
an insulation layer disposed between the first layer and the second layer.

16. The capacitive sense array of claim 15, wherein the first layer and second layer are indium tin oxide (ITO), and wherein the first plurality of electrodes and the third plurality of inactive electrodes are strips and the second plurality of electrodes are bars.

17. The capacitive sense array of claim 15, wherein the third plurality of inactive electrodes are configured to equalize baseline values of mutual capacitances between the first plurality of electrodes and the second plurality of electrodes.

18. A method comprising:
driving one or more transmit (TX) signals on one or more TX electrodes disposed in first orientation in a first layer of a sense array, wherein the sense array comprises one or more inactive electrodes disposed in a second orientation; and
measuring on one or more RX electrodes mutual capacitances between the one or more TX electrodes and the one or more RX electrodes, wherein the RX electrodes are disposed in the second orientation in a second layer of the sense array, wherein the one or more inactive electrodes are substantially aligned in relation to the one or more RX electrodes and wherein the RX electrodes and the one or more inactive electrodes comprise widths that are substantially the same.

19. The method of claim 18, further comprising:
determining baseline mutual capacitances when a conductive object is not proximate to sense array; and
detecting the conductive object proximate to the sense array based on the measured mutual capacitances and the baseline mutual capacitances.

* * * * *